United States Patent
Jimenez et al.

(10) Patent No.: US 7,679,436 B2
(45) Date of Patent: Mar. 16, 2010

(54) LOW NOISE AMPLIFIERS FOR LOW-POWER IMPULSE RADIO ULTRA-WIDEBAND RECEIVERS

(75) Inventors: Jose Luis Gonzalez Jimenez, Barcelona (ES); Diego Mateo Pena, Barcelona (ES); Enrique Barajas Ojeda, Barcelona (ES); Ignasi Cairo, Barcelona (ES); Masayuki Ikeda, Shiojiri (JP)

(73) Assignee: Seiko Epson Corporation (JP)

( * ) Notice: Subject to any disclaimer, the term of this patent is extended or adjusted under 35 U.S.C. 154(b) by 77 days.

(21) Appl. No.: 11/681,857

(22) Filed: Mar. 5, 2007

(65) Prior Publication Data

US 2007/0216481 A1    Sep. 20, 2007

Related U.S. Application Data

(60) Provisional application No. 60/780,018, filed on Mar. 6, 2006.

(30) Foreign Application Priority Data

Jun. 15, 2006    (EP)    ................................. 06115534

(51) Int. Cl.
    *H03F 1/14*    (2006.01)

(52) U.S. Cl. ........................... 330/51; 330/253; 330/311
(58) Field of Classification Search .................. 330/51, 330/311, 277, 285, 296
    See application file for complete search history.

(56) References Cited

U.S. PATENT DOCUMENTS

| | | | |
|---|---|---|---|
| 5,905,256 A | 5/1999 | Nakano | |
| 6,252,463 B1 | 6/2001 | Kobayashi | |
| 6,472,936 B1 * | 10/2002 | Jones | ........................... 330/51 |
| 6,577,185 B1 | 6/2003 | Chandler et al. | |
| 7,358,816 B2 * | 4/2008 | Ryu et al. | .................... 330/285 |
| 2005/0077965 A1 | 4/2005 | Li | |

(Continued)

FOREIGN PATENT DOCUMENTS

WO    WO 99/63656    12/1999

OTHER PUBLICATIONS

"First Report and Order: Revision of Part 15 of the Commission's Rules Regarding Ultra-Wideband Transmission Systems", U.S. Federal Communications Commission (FCC), ET Docket 98-153, Apr. 2002, pp. 1-118.

(Continued)

*Primary Examiner*—Khanh V Nguyen
(74) *Attorney, Agent, or Firm*—Harness, Dickey & Pierce, P.L.C.

(57) ABSTRACT

The present invention is related to low power low noise amplifiers (LNA) including on/off switching capability, which are preferably used for impulse radio (IR) ultra-wideband (UWB) receivers. In the invention a very low power and high-gain Common-Gate Capacitive Cross Coupling Cascaded LNA is proposed, to provide an optimum gain for large ON times. The invention provides also a Common-Source Cascoded LNA for shorter received pulse widths, with the aim of implementing a fast ON/OFF switching. An input signal is applied to a first amplifying stage and the switching means are coupled to a second amplifying stage so that they do not interfere with the matching network of the first stage. The invention is also related to a method of amplifying a radio frequency signal using a plurality of low noise amplifying elements.

35 Claims, 7 Drawing Sheets

U.S. PATENT DOCUMENTS

2005/0134373 A1  6/2005  Chen et al.
2007/0139117 A1* 6/2007  Iida ........................... 330/277

OTHER PUBLICATIONS

David J. Allstot, et al., "Design Considerations for CMOS Low-Noise Amplifiers", IEEE Radio Frequency Integrated Circuits Symposium (RFIC), 2004, pp. 97-100.

Takahide Terada, et al., "Transceiver Circuits for Pulse-Based Ultra-Wideband", Proceedings of the 2004 International Symposium on Circuits and Systems, IEEE, ISCAS, vol. 4, XP-002408543, pp. 349-352 (2004).

Wei Zhuo, et al., "Using Capacitive Cross-Coupling Technique in RF Low Noise Amplifiers and Down-Conversion Mixer Design", Proceedings of the 26$^{th}$ European Solid State Circuits Conference, ESSCIRC, XP-002408544, pp. 77-80 (2000).

* cited by examiner

LOW NOISE AMPLIFIERS FOR LOW-POWER IMPULSE RADIO ULTRA-WIDEBAND RECEIVERS

RELATED APPLICATIONS

This application is a non-provisional of U.S. Provisional Patent Application No. 60/780,018, filed Mar. 6, 2006. This application claims benefit of European Patent Application No. 06115534, filed Jun. 15, 2006. The disclosures of the above applications are incorporated herein by reference.

FIELD OF THE INVENTION

The present invention is related to low power low noise amplifiers (LNA) including on/off switching capability, which are preferably used in impulse radio (IR) ultra-wideband (UWB) receivers.

In the invention a very low power and high-gain common gate amplifier is proposed. This first LNA provides an optimum gain for large ON times, so that the best effectiveness of this topology is obtained when the pulse length is long enough (in the range of several ns).

The invention provides also a second LNA for shorter received pulse widths, with the aim of implementing a fast enough ON/OFF switching.

When the LNAs are operated continuously (i.e., infinite ON time) the second LNA has a lower gain for the same power consumption than the first one. However, if the ON/OFF switching technique is applied, the second topology achieves higher gain for shorter ON times, which implies that it is best suited for higher data rates.

The invention is also related to a method of amplifying a radio frequency signal using a plurality of active and passive devices with a configuration that provides low noise amplification.

BACKGROUND

Since the publication of the paper: FFC, "*First Report and Order: Revision of part 15 of the commission's rules regarding ultra-wideband transmissions systems,*" *FCC,ET Docket* 98-153, April 2002, by the United States Federal Communications Commission (FCC), Ultra-Wideband (UWB) communication techniques have received increasing attention for short-range, high-data rate wireless communication applications. Impulse Radio (IR) implementation of such UWB systems has become a very interesting candidate due to its low complexity, low power consumption, low cost, high data rate and the ability of coexistence with other radio systems.

In its usual realization, an IR-UWB transmitter consists on a pulse generator that is triggered regularly by a timing circuitry, that is the IR-UWB is based on the transmission and reception of very short pulses at a certain periodicity. The output of the pulse generator is connected directly to the antenna. No Power Amplifier is needed since the UWB transmitted power is very low. Data is transmitted by modifying some parameter of the pulse (for example, its sign in BPSK modulation or its position in PPM modulation). The transmitted output waveform has a very small duty cycle since the sub-nanosecond pulses are sent every frame, which for usual data rates has a duration of several nanoseconds.

Time Hoping (TH) technique is commonly used to allow multiple users access and to avoid peaks in the spectrum of the UWB signal. A pseudorandom code locates each successive pulse in a different position along its frame. The IR-UWB receiver can be implemented in several ways, but the present invention is focused on a very low-power implementation for short distances (less than 1 meter for Body Area Network, BAN, applications). A possible architecture for such IR-UWB receiver is shown in FIG. 2.

This architecture corresponds to a coherent receiver that decides the output data symbol after integrating the result of the multiplication of the received signal with a locally generated template waveform. A Low Noise Amplifier (LNA) is needed at the input, in order to adapt the antenna impedance to the input and to minimize the noise of the receiver chain by providing enough gain. The LNA has to add low noise by itself to the received signal.

As the received waveform has a very small duty cycle, blocks such as the LNA, the multiplier or the integrator do not need to operate continuously, just when the pulse is received. By applying a clever ON/OFF switching on these blocks an important saving of power consumption can be obtained. Additionally, the receiver chain is built fully differential in order to minimize the influence of the substrate noise coupled from the digital section of the receiver (to be integrated in the same die) as well as to reduce the undesired effects due to the coupling of the ON/OFF switching signal itself.

As in other systems that work in burst mode, IR-UWB receiver front-ends can ideally work only when a pulse is expected to arrive. Switching ON and OFF the LNA is a known technique that allows an important power saving. For example, assuming a received pulse of duration 1 ns, and a data rate of 100 Mps, an ideal power reduction of 90% can be achieved if the front-end blocks are turned ON only during the pulse time. In practice the power saving will not be so high, as the LNA must be switched ON some time in advance to the reception of the pulse in order to be completely stabilized when the pulse arrives.

A LNA with power switch is described in the technical paper entitled "*Transceivers circuits for pulse-based ultra-wideband*" in the *IEEE Journal* 0-7803-8251-X/2004 IEEE. FIG. 1 represents an analog circuit of a LNA with power switch described on said paper, in which the power consumption is reduced by switching the bias current, 'which is the advantage of the discontinuous feature of the pulse based UWB.

The LNA of FIG. 1 uses a technique of switching OFF and ON one of the active devices of each branch by acting over the gate of said devices, to interrupt the flow of current between VDD and GND. This is done typically using NMOS cascode/cascade transistors because their gate can be DC powered to VDD in the ON state. Shorting it to ground in the OFF state effectively powers down the amplifier. More in detail, in the LNA of FIG. 1 the circuit is powered down by means of transistors (Tr1), (Tr2) connecting to ground the gates of the transistors which receive a RF input signal (RFin). In that switching scheme, the transistors (Tr1), (Tr2) used to perform the on/off switching, interfere with the input signal path and the input matching network and consequently negatively affect the LNA gain and linearity. Transistor (Tr3) is used to disconnect the whole amplifier from the power supply.

On the other hand, a Capacitive Cross-Coupling (CCC) technique is known to improve the performance of a differential amplifying stage. More details of this CCC technique can be found on the papers: "Wei Zhou, Sherif Embabi, José Pineda de Gyvez and Edgar Sanchez Sinencio, "*Using Capacitive Cross-Coupling Technique in RF Low Noise Amplifiers and Down-Conversion Mixer Design*", in the *Proceedings of the European Solid-State Circuits Conference(ESSCIRC)*, Sep. 19-21, 2000 Page(s):77-80", and "David J. Allstot, Xiaoyong Li, and Sudip Shekhar, "*Design Considerations for CMOS Low-Noise Amplifiers*", in *IEEE Radio Frequency Integrated Circuits Symposium (RFIC)*, 2004, pp. 97-100".

SUMMARY

The present invention provides a Low Noise Amplifier LNA for UWB systems and more preferably for coherent IR-UWB receivers. A low-power operation achieved by the simple structure of the LNA in addition to its differential output makes it a good candidate to enable low-cost, low-power and moderate data-rate single chip IR-UWB transceivers for instance for smart tags, sensor networks or body area network (BAN) communication applications.

A first aspect of the invention refers to a low noise amplifier LNA which comprises at least first and second amplifying elements coupled to cooperate in amplifying an input signal, so that the first amplifying element has an input node to receive said input signal, and wherein switching means are coupled to the second amplifying element to switch on and off the whole LNA by switching on and off said second amplifying element together with the rest of LNA configuring elements. Therefore, the LNA is switched on and off only by switching on and off the amplifying element that does not receive the input signal.

An output terminal of the first amplifying stage or element is coupled to an input terminal of the second amplifying element, so that a signal amplified by the first amplifying element is subsequently amplified by the second amplifying element. An output node of the amplifier is coupled to the second amplifying element.

In the present invention, while the input signal to be amplified is applied to the first amplifying stage, the on/off switching is applied only to the second amplifying stage, so that the switching means do not interfere with the input matching network of the first amplifying stage.

Another aspect of the invention refers to a method of amplifying a radio frequency signal using active and passive devices with a configuration that provides low noise amplification. The method comprises the reception of a radio frequency signal pulse frame and inputting the received signal to an amplification element, and switching ON the amplifier only during a time window substantially similar to the duration of said pulse frame, characterised in that the signal pulse frame is applied to a first amplifying element, and the amplifier is switched on and off by acting on a second amplifying element coupled to said first amplifying element.

In the method of the invention, an output signal from the first amplifying element is applied as input signal to the second amplifying element, so that both amplifying elements cooperate in amplifying said signal. The first amplifying element preferably is a common gate transistor and the second amplifying element is a common source transistor, and the signal at the drain of the common gate transistor is applied to the gate of the common source transistor. The common source transistor is switched on and off by acting on the bias applied to its gate terminal.

Alternatively, the first amplifying element is a common source transistor and the second amplifying element is a common gate transistor coupled in a cascode configuration. The amplifier is switched on and off by acting on the bias applied to the gate terminal of the common gate transistor.

BRIEF DESCRIPTION OF THE DRAWINGS

The features of the invention will be better understood by reference to the accompanying drawings, which illustrate preferred embodiments of the invention.

DETAILED DESCRIPTION

It is well known that narrowband interferences can be the most limiting factor in IR-UWB systems. An architectural solution commonly adopted is to filter the interferences in reception as much as possible (for example, interferences due to wireless systems operating in the 2.4 and 5 GHz ISM bands). Such filtering implies losing some of the energy of the pulse around the interferences frequencies.

In a preferred embodiment of the invention, a central frequency of 8 GHz has been adopted for the amplifier, and a limited −3 dB bandwidth of 1 GHz, avoiding the crowded 2.4 GHz and 5 GHz bands. To attenuate the effect of the above mentioned interferences, two LNAs have been designed in the present invention having a resonant behaviour. Although it could seem surprising in a UWB application, the resulting pass band obtained is wide enough to receive correctly a pulse whose energy is centered around 8 GHz.

The most important characteristics typically required for a LNA are low noise, high gain and acceptable linearity. The required power consumption strongly depends on the application. In the present invention where the communication systems are preferably integrated in sensor networks or BAN devices with energy harvesting techniques, power consumption, together with gain and the mentioned central frequency, are the most important design constraints, whereas an acceptable noise figure (not the lowest possible) is enough.

Common-Gate Capacitive Cross-Coupling Cascaded Low Noise Amplifier, CG CCC LNA

Figure 1:
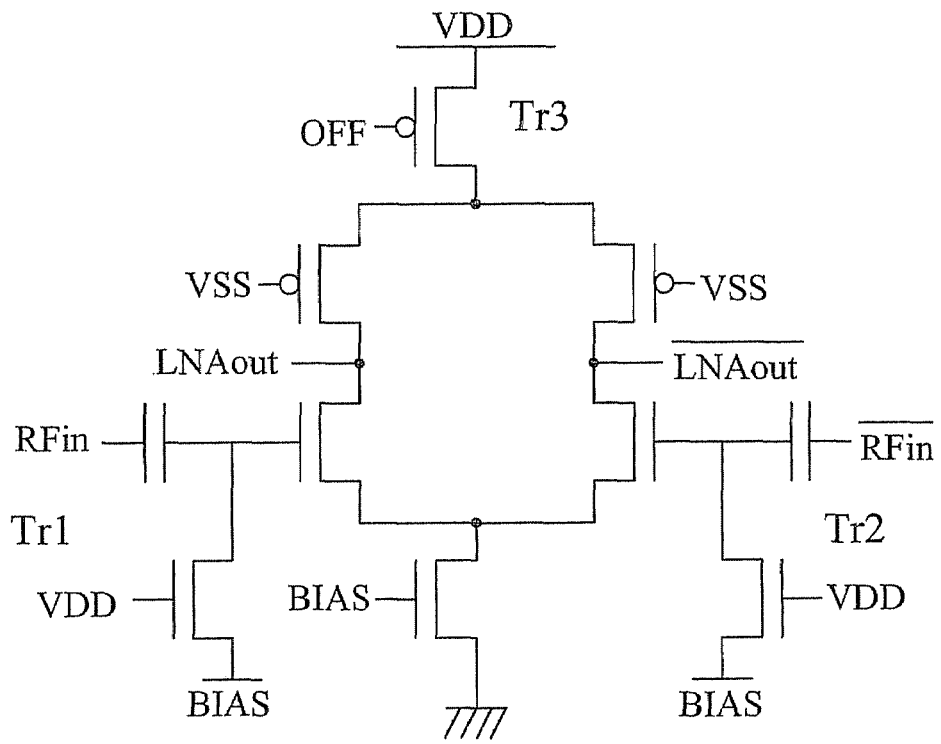
FIG. 1 shows a prior-art LNA topology including on-off switching capability.
Figure 2:
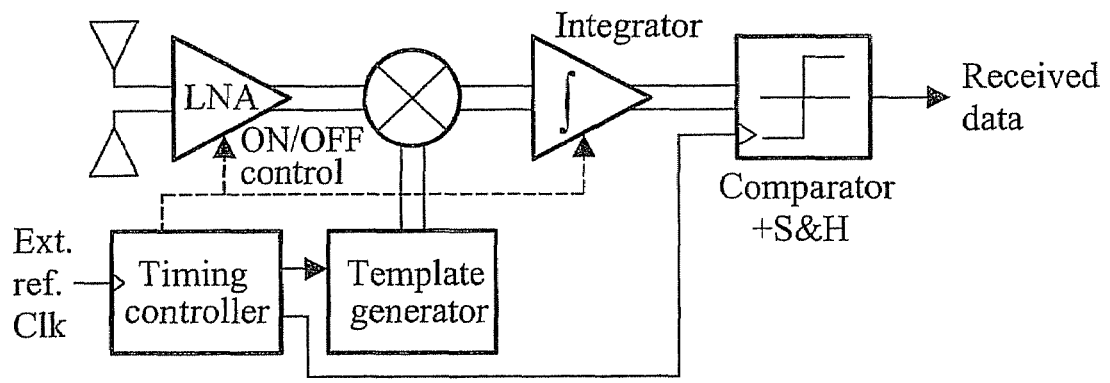
FIG. 2 shows a block diagram of an architecture for an impulse-radio receiver.
Figure 3:
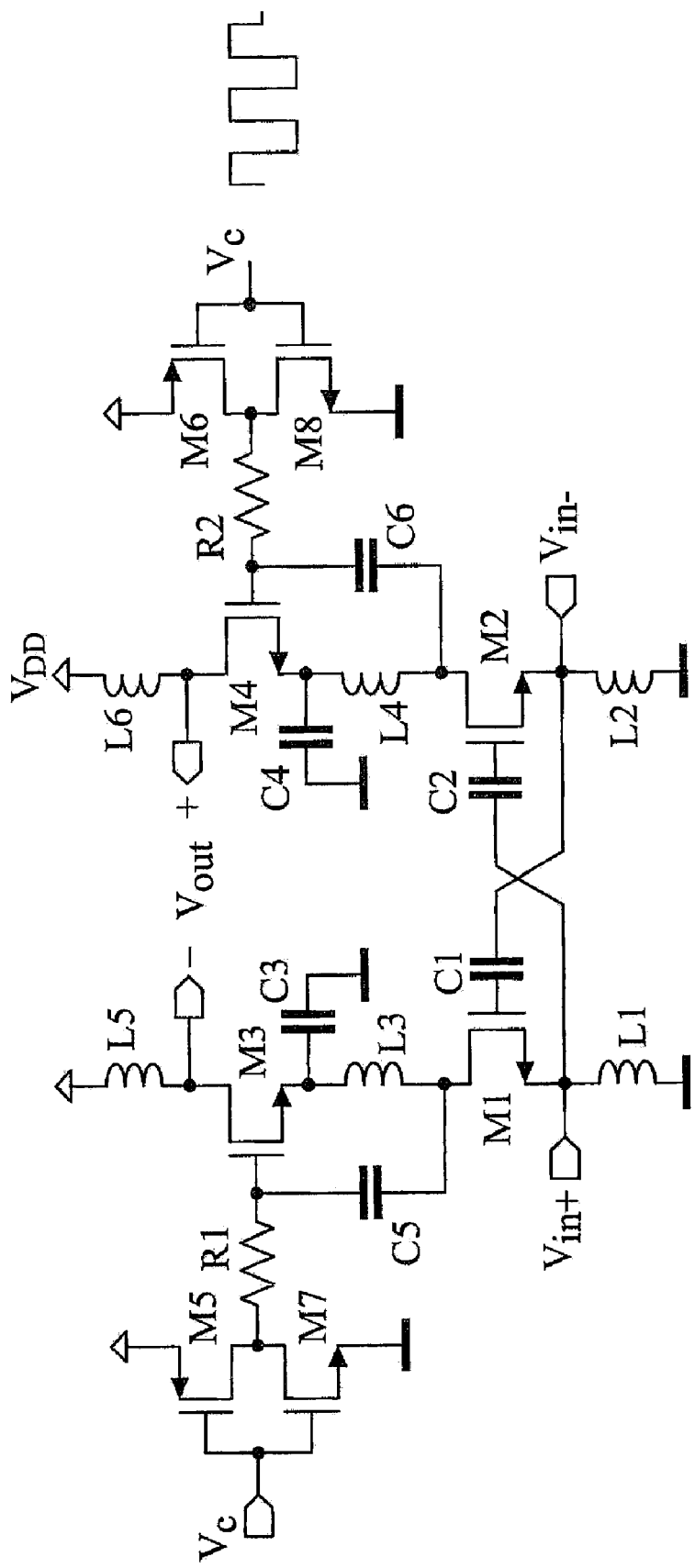
FIG. 3 shows a preferred embodiment of a Common Gate Capacitive Cross Coupling Cascaded LNA.

Having all these issues in mind, a first preferred design of a LNA according to the invention has been represented in FIG. 3. This first LNA is composed by two symmetrical circuit branches to implement a differential amplifier, and comprises a differential Common Gate (CG) input stage composed of a first transistor (M1) and a second transistor (M2) (biasing resistors in its gates are omitted for simplicity), with first inductor (L1) and second inductor (L2) connected respectively between the source of the first and second common gate transistors (M1,M2) and ground, to choke the signal path to ground.

Such a CG input allows the use of the Capacitive Cross Coupling (CCC) technique by means of first capacitor (C1) and second capacitor (C2), which basically improves the CG stage gain.

More in detail, a first coupling capacitor (C1) is connected between the gate of the first common gate transistor (M1) and the source of the second common gate transistor (M2), and a second coupling capacitor (C2) is connected between the gate of (M2) and the source of (M1). Alternatively, a Cross Coupling scheme can be implemented without the use of coupling capacitors, in which case the gate of transistor (M1) is connected directly to the source of transistor (M2), and the gate of transistor (M2) is connected directly to the source of transistor (M1).

On top of the CG stage, a common source (CS) stage is provided for the first and second differential branches of the circuit. This CS stage is composed by a third transistor arranged as a first common source transistor (M3) for a first circuit branch, and a fourth transistor arranged as a second common source transistor (M4) for a second circuit branch. The CS stage reuses the same DC current of the CG input stage as an efficient power consumption saving technique.

The drains of the common gate transistors (M1,M2) are respectively coupled to the gates of the common source transistors (M3,M4), through a first impedance, the value of said first impedance being selected at least in part to couple a signal at the drain of the common gate transistors (M1,M2) to the gates of the common source transistors (M3,M4). In this arrangement an AC signal is applied from the CG stage to the CS stage, so that both transistors are cooperating in amplifying an input signal in a cascaded configuration. Said impedances are preferably a fifth coupling capacitor (C5) for transistors (M1,M3) and a sixth coupling capacitor (C6) for transistors (M2,M4), as shown in FIG. 3.

Furthermore, a second impedance is connected between the sources of the common source transistors (M3,M4) and the drains of the common gate transistor (M1,M2), the value of said second impedance being selected at least in part to prevent a signal at the drain of the common gate transistor (M1,M2) from entering into the common source transistor (M3,M4). Said second impedance consists preferably in a third choke inductor (L3) for transistors (M1,M3) and a fourth choke inductor (L4) for transistors (M2,M4).

Bypass third and fourth capacitors (C3) and (C4) are respectively connected between the source of the transistors (M3,M4) and ground. Choke inductors (L3,L4) and capacitors (C3,C4) prevent said AC signal from entering into the CS stage through the sources.

The switching means are coupled to the gate of the common source transistors (M3,M4) through an impedance, preferably through resistors (R1,R2) which value is selected to at least in part to prevent a signal at the gate of the common source transistors (M3,M4), from entering into the switching means.

As it can be seen in FIG. 3, the drain of the common source transistors (M3,M4) are coupled to the DC power supply through an impedance, preferably though a through a fifth choke inductor (L5) and a sixth choke inductor (L6) respectively.

Input nodes (Vin+) and (Vin−) are respectively coupled to the source terminal of the first and second common gate transistors (M1,M2), and output nodes (Vout+) and (Vout−) are respectively coupled to the drain terminals of the first and second common source transistors (M3,M4).

Alternatively the LNA of FIG. 3, can be implemented without a CCC scheme, in which case the input nodes (Vin+) and (Vin−) are connected to the gate terminals of the first and second transistors (M1,M2), in which case these transistors will be arranged as common source transistors.

Also, in another preferred embodiment of the invention, the LNA of FIG. 3, can alternatively be implemented with a single circuit branch comprising only the transistors (M2) and (M4), or only the transistors (M1) and (M3), and the associated impedances as previously described and shown in the left (first) and right (second) circuit branches of FIG. 3, in which case obviously the cross-coupling scheme could not be used.

Figure 5:
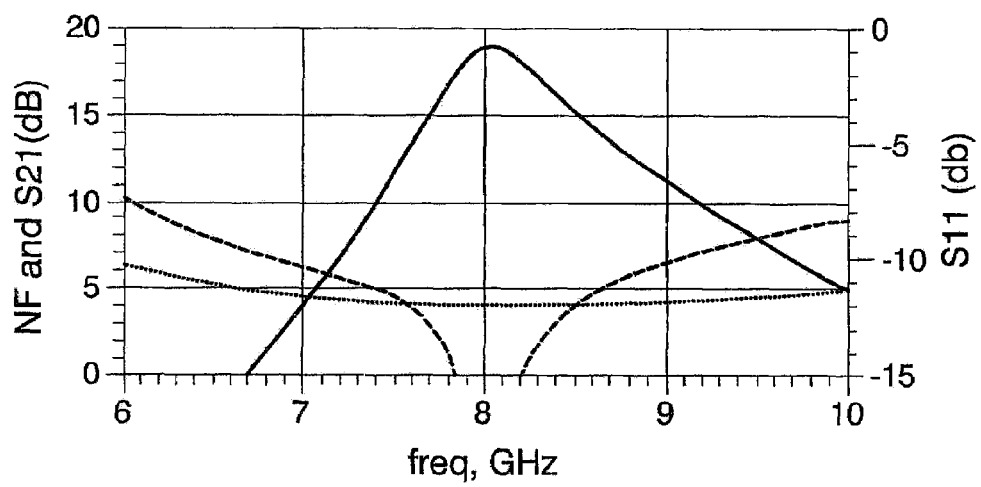
FIG. 5 shows a diagram of the power gain S21 (solid line, left axis) and Noise Figure NF (doted line, left axis) and reflection coefficient S11 (dashed line, right axis) of the CG-CCC LNA of FIG. 3.

The design is optimized for power consumption and gain, not for noise neither for linearity. In FIG. 5 the power gain (S21) of the LNA of FIG. 3 is shown, where it can be observed that a gain of about 18 dB is obtained at 8 GHz, together with a −3 dB bandwidth of about 1 GHz. The attenuation provided at 2.4 GHz is 73 dB with respect to the central frequency, and 36.7 dB at 5 GHz. The distortion that the LNA causes into the pulse shape due to its limited bandwidth has been proved not to affect the overall system performance. In the same FIG. 5 the noise figure is also plotted. A value around 4 dB is obtained in the band of interest. As it can be seen, good input matching is also achieved. Finally, the DC power consumption obtained for continuous operation of this example is 4.87 mW.

Common-Source Cascoded Low Noise Amplifier, CS Cascoded LNA.

Figure 4:
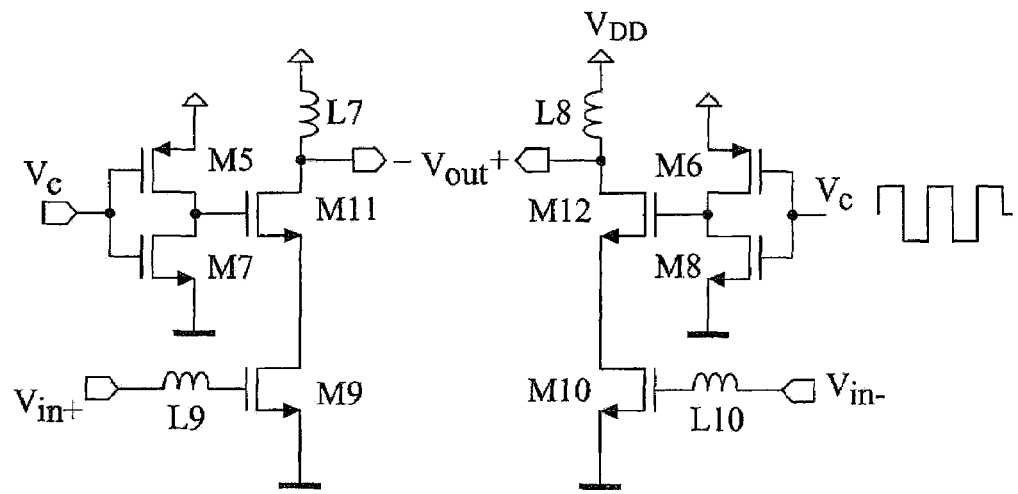
FIG. 4 shows a preferred embodiment of a Common Source Cascoded LNA.

In FIG. 4 the second LNA topology designed in the present invention is shown. It is a differential common source cascoded LNA, with choke seventh and eighth inductors (L7) and (L8) as loads.

In the left branch of the circuit of FIG. 4, a ninth transistor is arranged as a third common source transistor (M9), and an eleventh transistor is arranged as third common gate transistor (M11). The source of the common gate transistor (M11) is connected to the drain of common source transistor (M9) so that both transistors are coupled in a cascode configuration to cooperate in a known manner in amplifying an input signal.

Similarly in the right branch of this circuit, a tenth transistor is arranged as a fourth common source transistor (M10), and a twelfth transistor is arranged as fourth common gate transistor (M12). The source of the common gate transistor (M12) is connected to the drain of common source transistor (M10) so that both transistors are coupled in a cascode configuration. Biasing resistors of transistors (M9-M12) are omitted for simplicity.

In this embodiment, the switching means are connected directly to the gate terminal of the common source transistors (M11,M12).

Input ports (Vin+) and (Vin−) are respectively coupled to the gate of the common source transistors (M9,M10), and output ports (Vout+) and (Vout−) are respectively coupled to the drains terminals of the common gate transistors (M12, M11).

The input ports (Vin+) and (Vin−) are preferably coupled to the gate of the common source transistors (M9,M10), respectively through ninth and tenth inductive impedances (L9, L10), which are selected at least in part to match the input impedance (no source degeneration is used in order to maximize gain).

The drains of the common gate transistor (M11,M12) are coupled to the DC power supply, respectively through choke inductors (L7,L8).

In another preferred embodiment of the invention, the LNA of FIG. 3 can alternatively be implemented with a single circuit branch comprising only transistors (M9) and (M11) or only transistors (M10) and (M12), and the associated impedances as previously described and shown in the left and right symmetric circuit branches of FIG. 4.

With this structure, the gate of the cascoded transistors (M11) and (M12) can be switched ON/OFF very fast, as they do not belong to the signal path (that is, no choke resistor is needed), and no special voltage must be used at the gate: when the gate is connected to ground it powers down the LNA and when it is connected to VDD it powers it up.

Figure 8:
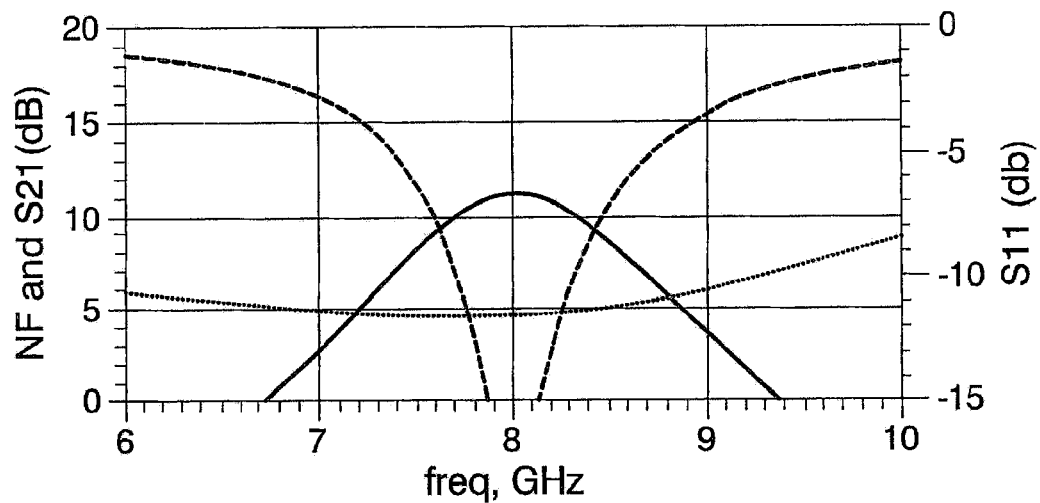
FIG. 8 shows a diagram of the power gain S21 (solid line, left axis) and NF (doted line, left axis) and reflection coefficient S11 (dashed line, right axis) of the CS cascoded LNA, of FIG. 4.

In FIG. 8 the power gain (S21 parameter), noise figure, and reflection coefficient (S11 parameter) are shown. In order to make fair comparisons, this second LNA has been designed to consume the same continuous-operation DC power than the previous one (4.87 mW). We observe that the gain is 8 dB lower than in the previous LNA, noise figure is about 0.5 dB higher, and the input matching is, although acceptable, slightly worse. The attenuation (relative to the peak gain) provided at 2.4 GHz is 42.3 dB, and 24.7 dB at 5 GHz. That is, for the same power consumption, performances are lower than in the first LNA of FIG. 3.

Figure 9:
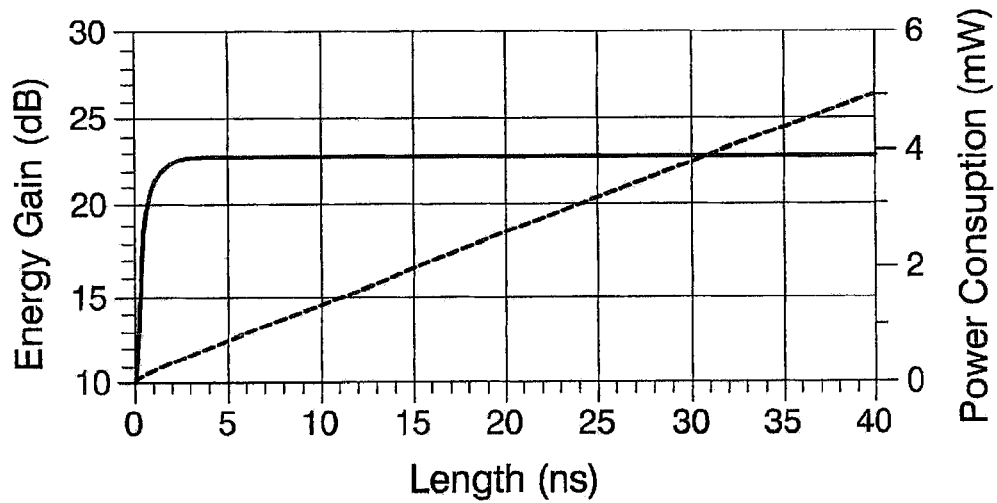
FIG. 9 shows a diagram of the energy gain (solid line, left axis) and dissipated power (dashed line, right axis) versus window/pulse length, for the CS cascoded LNA of FIG. 4.

The advantage of this alternative topology is its capability for using a fast ON/OFF switching technique with great performances. FIG. 9 shows the power consumption and gain curves for this second LNA when the ON/OFF technique is used, for the same input signal and range of ON times used in the previous section. A similar behaviour in terms of power saving is observed, but it achieves a much better performance in terms of gain when an aggressive duty cycle is applied to the LNA: for example, only 1 dB of gain is lost with respect to the maximum gain when a ON time of only 2 ns is used, what allows a power consumption cut down to only 0.4 mW.

The usual way of switching OFF and ON an analog block is by acting over the gate of one of the active devices, that is the amplifying elements or transistors, of each circuit differential branch, to interrupt the flow of current between VDD and GND. This is done typically in NMOS cascode/cascade transistors because their gate can be DC powered to VDD in the ON state. Shorting it to ground in the OFF state effectively powers down the amplifier. For example, the LNA shown in FIG. 3 is powered down by switching off transistors (M3) and (M4), that is, the transistors which do not receive the input signal.

In the present invention it has been considered that some of the key issues when applying this technique to high frequency amplifiers are: first, as the central frequency is so high, the devices used to perform the ON/OFF switching must not interfere with the signal path since it would affect the LNA gain; second, when the data rate is high, the block must respond very fast to the switching in order to be energetically efficient. In order words, the gate of the transistor to be controlled must be a low impedance node, otherwise the switching will not be fast enough, the ON time would have to be increased, and consequently, less power will be saved.

In the LNA of FIG. 3, all the gates of the LNA transistors carry signal (the gates of the CG stage are used for the cross-coupling technique, and the gates of the CS states are connected to the output signal of the previous CG stage). This complicates the implementation of the ON/OFF switching, but a satisfactory result have been obtained by controlling the gate of the cascaded CS stage (see in FIG. 3 the buffers made of transistors M5-M7 and M6-M8). Choke resistors (R1) and (R2) are connected between the buffers and the CS gates to minimize the losses of the LNA gain, since signal passes through this node. In order to optimally size these resistors, a trade-off must be made between fast response of the LNA to the control signal (Vc) (low values of R1, R2) and low loss of LNA gain (high values of R1, R2).

In a preferred embodiment of the invention, the switching means comprises a pair of complementary transistors arranged to operate as a switch. More in particular, the switching means comprise a pMOS fifth and sixth transistors (M5,M6), and nMOS seventh and eighth transistors (M7, M8). The drains of said transistors are coupled together, and the gates of said transistors are connected together to a control node (Vc). The sources of the pMOS transistors (M5,M6) are connected to the DC power supply, and the sources of the nMOS transistors (M7,M8) are connected to ground.

In the case of the LNA of FIG. 3, the drains of transistors (M6,M8) are coupled to the gate of transistor (M4) through a second resistor (R2), and the drains of transistors (M5,M7) are coupled to the gate of transistor (M3) through a first resistor (R1).

In the case of the LNA of FIG. 4, the drains of pairs of transistors (M6,M8), (M5,M7) are respectively connected directly to the gate of transistors (M12) and (M11).

For both LNAs described, the switching means are operable by a square signal generated in a known manner, which is applied to the control node (Vc). Taking as example the LNA of FIG. 3, in the positive voltage values of said square signal (Vc=Vdd), the transistors (M5) and (M6) are turned off and the transistors (M7) and (M8) are activated, and consequently the gates of transistors (M3) and (M4) are connected to ground so that transistors (M3), (M4) are switched off. In the negative voltage values of said control square signal (Vc=GND), transistors (M5) and (M6) are activated and transistors (M7), (M8) are turned off, for that the gates of transistors (M3) and (M4) are coupled to the power supply VDD and are thereby switched on.

Therefore the switching means provide a double function, which are to activate or switch off the transistors (M3), (M4) for the LNA of FIG. 3.

The switching means applied to the LNA of FIG. 4 operate in the same manner.

The effectiveness of the ON/OFF switching technique has been investigated by simulation using a pulse consisting of a sinusoidal burst with 8 GHz of frequency and a length of several cycles as input signal. The LNA is turned ON during a time window equal to the pulse duration (see FIG. 6). In FIG. 7 the power dissipated by the LNA is shown. The integration period considered to calculate the power is the maximum window length used, i.e. 40 ns. In the same figure, the gain of the LNA under the switching conditions is shown. The S21 parameter can not be used as gain in such situation, due to the LNA ON/OFF behaviour, since now the gain is a large signal magnitude. Instead of S21 we can use the Energy Gain, defined as:

$$\text{EnergyGain(dB)} = 10\log\left(\frac{\int V_{out}^2 dt}{\int V_{in}^2 dt}\right) \quad (1)$$

Now the power consumption in continuous operation is 5.1 mW (it is slightly larger than 4.87 mW due to the power overhead of the switching circuitry). The power consumption curve of FIG. 7 clearly shows the power reduction obtained by applying the switching technique. For example, power consumption is reduced to 0.2 mW for a window length (ON time) of 5 ns. Nevertheless, due to the choke resistors (R1), (R2) needed after the buffers which control the switching of the CS transistors, the switching is slow, and the ON time must be much larger than the pulse duration in order to have some gain. The gain curve of FIG. 7 indicates that in order to avoid a gain reduction from the maximum less than −3 dB, the ON time must be larger than 15 ns, what implies that the power consumption is reduced only in 3 mW, less than expected. The LNA of FIG. 4, improve the effectiveness of the switching technique in terms of power saving for high data rates.

Figure 10:
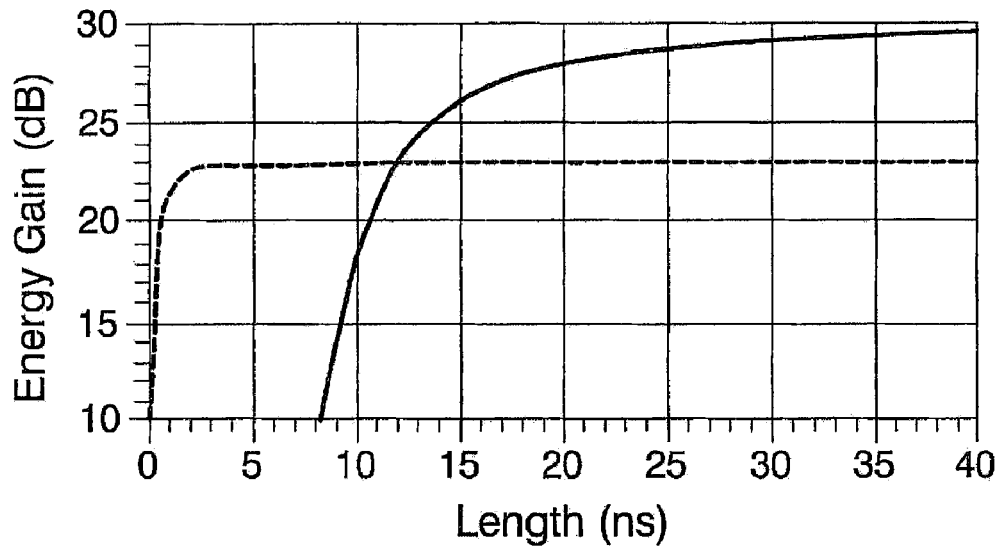
FIG. 10 shows a diagram of the energy Gain versus window/pulse length, for the CG CCC cascaded LNA (solid line) of FIG. 3 and for the CS cascoded LNA (dashed line) of FIG. 4.

Noise Figure and adaptation do not differ very much between both LNAs, so only gain, as defined in equation (1), and power consumption are considered. In FIG. 10 the same curves corresponding to the energy gain of both LNAs previously obtained are plotted together. We can observe that for short pulses the CS cascoded LNA behaves much better than the other (indeed, the CG CCC cascaded LNA does not work for ON times below 5 ns). But in cases where the pulse is in the order of about 12 ns of length or more, the CG CCC cascaded LNA behaves better in terms of gain, achieving till 7 dBs more gain than the CS LNA.

Figure 11:
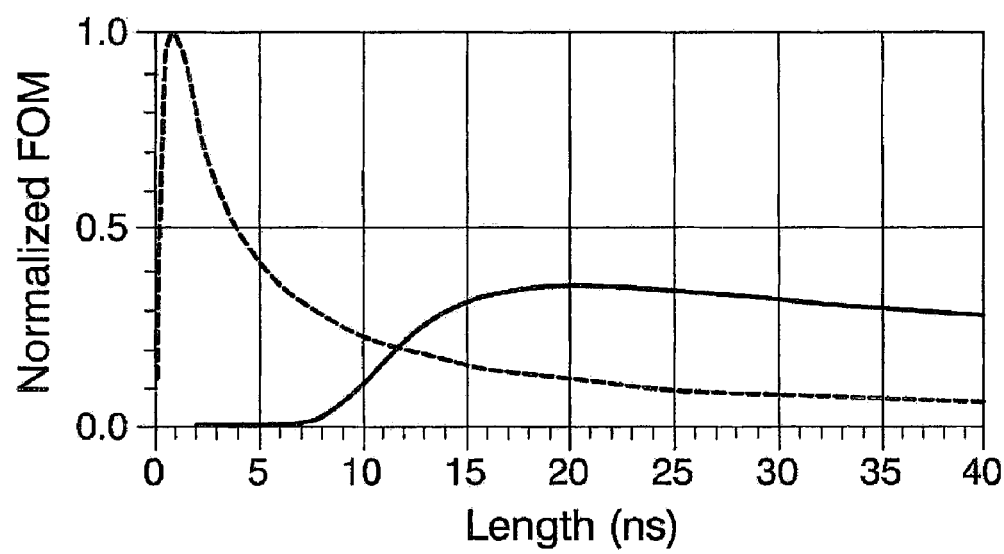
FIG. 11 shows a diagram of the Normalized Fig. of Merit for the CG CCC cascaded LNA (solid line) and for the CS cascoded LNA (dashed line).

To compare both LNAs taking into account also the power consumption, the following Figure Of Merit has been defined:

$$FOM = \frac{\text{Energy Gain}}{\text{Dissipated Power}}, \quad (2)$$

where both parameters, Energy Gain (defined as equation (1)) and Dissipater Power, are in linear scale. In FIG. 11 this normalized FOM is plotted for different input pulse and window length. We can derive again that, by using this figure of merit, the CS cascoded LNA is suitable for short pulses (around few ns) and the CG-CCC cascaded LNA for longer pulses (more than 10 ns). We can also say that, in absolute terms, the CS cascoded LNA behaves better than the CG-CCC cascaded LNA, due to its greater power consumption saving, achieved through the ON/OFF switching technique.

Figure 6:
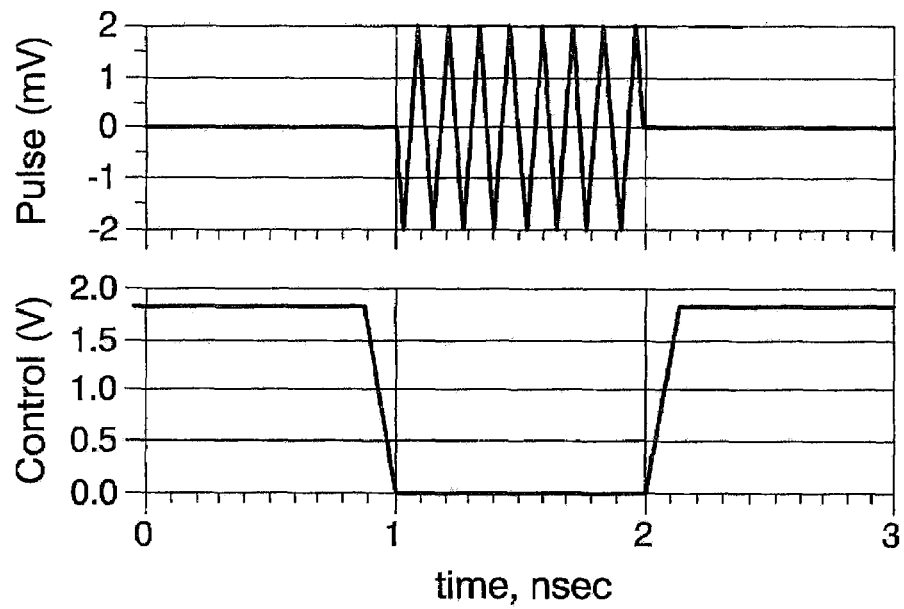
FIG. 6 shows a diagram of an example of a sinusoidal pulse frame used as input (top) and a diagram of the control voltage Vc (bottom).
Figure 7:
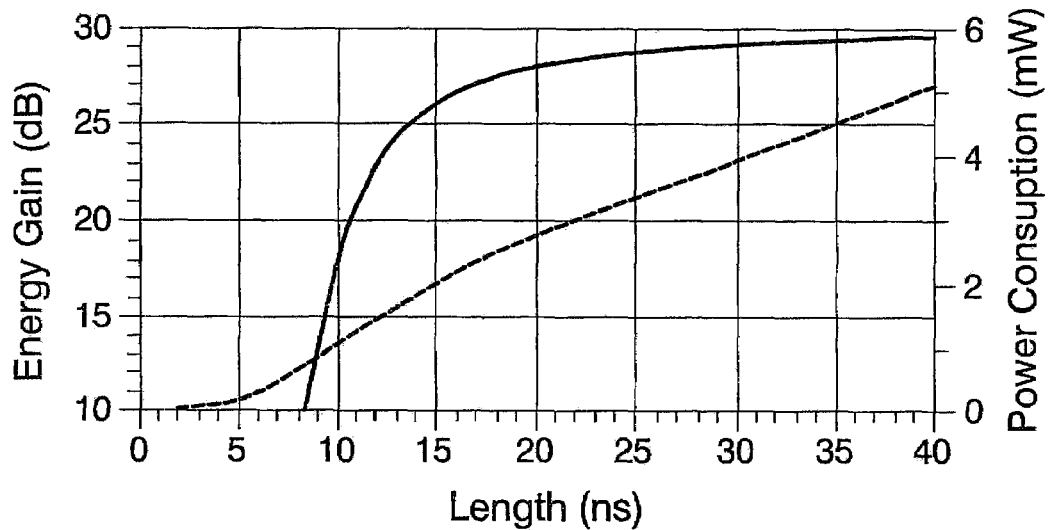
FIG. 7 shows a diagram of the energy gain (solid line, left axis) and dissipated power (dashed line, right axis) versus window/pulse length, for the CG CCC cascaded LNA of FIG. 3.

Until now different pulse durations have been considered (parameter "Length" in the figures), assuming an ON time equal to the pulse duration (see FIG. 6). This is reasonable if we think that the best way to detect the pulse is to use all its energy. However, when power consumption is also taken into account, an interesting trade-off appears: for an arbitrary length of the received pulse it may be possible to use only part of its energy for detection, obtaining less gain but consuming less power. That is, the gain is traded-off for power consumption using the ON/OFF switching technique.

Figure 12:
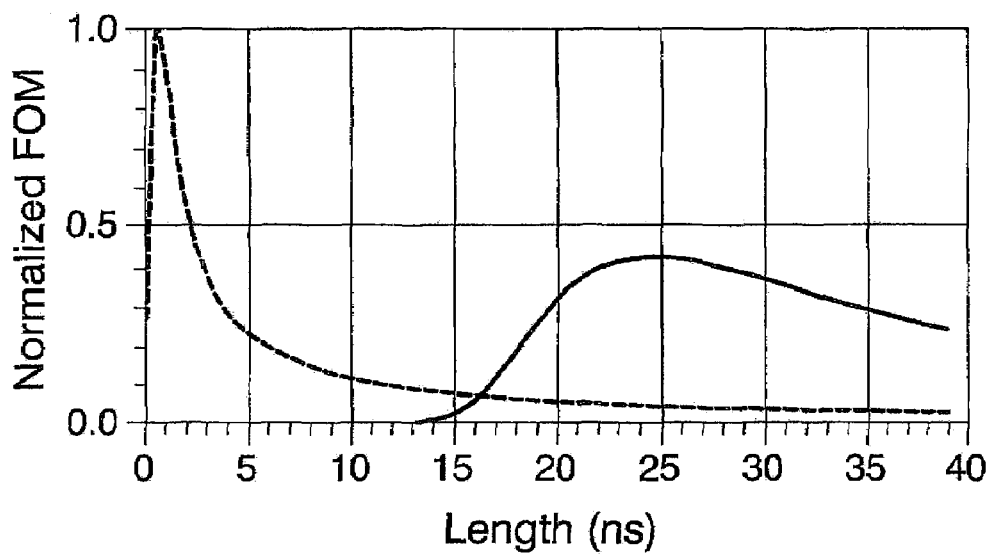
FIG. 12 shows a diagram of the Normalized Fig. of Merit for the CG CCC cascaded LNA (solid line) and for the CS cascoded LNA (dashed line), when a pulse of a fixed length of 750 ps is received, for different receiving windows lengths.
Figure 13:
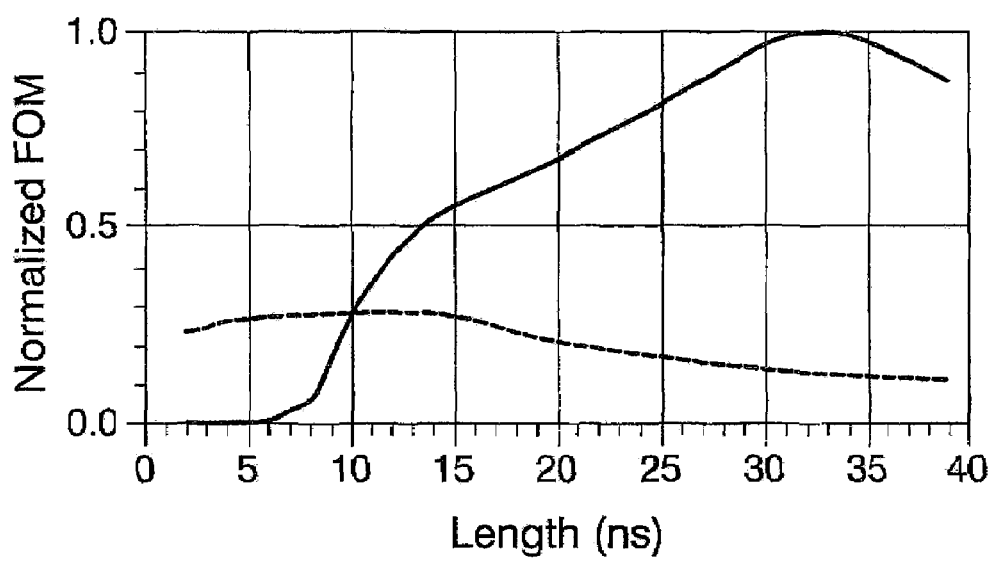
FIG. 13 shows a diagram of the Normalized Fig. of Merit for the CG CCC cascaded LNA (solid line) and for the CS cascoded LNA (dashed line), when a pulse of a fixed length of 15 ns is received, for different receiving windows lengths.

Similar simulations have been performed but considering the length of the received pulse fixed and varying the length of the receiving window. In FIG. 12 we can see such a case for a short received pulse of 750 ps. Since in this case there is no possibility for trading-off energy for power consumption because of the shortness of the pulse, plots do not differ significantly from those in FIG. 11. When a longer received pulse of 15 ns is considered, plots in FIG. 13 are obtained. We can see how the CS cascoded LNA has a flat zone below 15 ns (after that point, which is the length of the pulse, the FOM decreases: obviously it makes no sense to keep the LNA working after the end of the pulse, as it increases the dissipated power without increasing the received energy).

Such flat zone means that, considering our figure of merit, the performance of the LNA is almost constant below 15 ns, that is, by using a shorter ON window we save power, at the price of losing gain. Looking at the normalized figure of merit of the CG CCC cascaded LNA, we can see that in the case of a longer pulse such LNA obtains a higher performance for windows lengths greater than 10 ns, and it keeps increasing as the receiving window widens until about 32 ns (when it starts to decrease). This is due to the slowness of this LNA to respond to the switching, which needs about 15 ns more than the length of the pulse to respond perfectly to it.

A comparison of the performances of both LNAs with state of the art LNAs is presented in Table I. Although the comparison is not straightforward due to the wide variety of implementations (0.13 and 0.18 μm technologies, single and differential output, lower and upper frequency band, continuous and ON/OFF working mode), we have tried to show the whole picture of the state of the art. If we compare the CG CCC cascaded LNA of the present invention (which has high performances when working continuously) with the others it has been found that it behaves very well (indeed, it is the LNA with the highest Gain/Power figure of merit). If the ON/OFF switching is applied it saves some power, although the best performance is obtained at medium and low data-rates, i.e. for long ON times.

The CS cascoded LNA of FIG. 4, which uses efficiently a fast ON/OFF switching, can be compared with the only LNA that also use this technique, obtaining that our implementation consumes less: although in Table I a consumption of 0.22 mW@25 Mpps is given since this is the data directly obtained from the plotted curves, is possible to directly extrapolate this figure to 0.44 m W@50 Mpps, a 34% less than Reference [8].

TABLE I

Comparison of Different Implementations:

| Ref | Technology | Topology[1] | BW (GHz) | Gain (dB) | S11 (dB) | NF (dB) | Pdiss[4] (mW) | Pdiss (mW) ON/OFF |
|---|---|---|---|---|---|---|---|---|
| (7) | 0.18 μm CMOS | CS, cascoded, single ended | 2.3-9.2 | 9.3 | <−9.9 | 4.0-7.0 | 9 | — |
| (8) | 0.18 μm CMOS | CS, differential | 0.1-1.0 | 18 | — | 5.3[2] | — | 0.671@ 50 Mpps |
| (9) | 0.18 μm CMOS | CS, shunt-feedback, single ended | 2.0-4.6 | 9.8 | <−9 | 2.3[2] | 12.6 | — |

TABLE I-continued

Comparison of Different Implementations:

| Ref | Technology | Topology[1] | BW (GHz) | Gain (dB) | S11 (dB) | NF (dB) | Pdiss[4] (mW) | Pdiss (mW) ON/OFF |
|---|---|---|---|---|---|---|---|---|
| (10) | 0.18 μm CMOS | CS cascoded + SF, sing. ended, tunable | 6.0-10.0 | 11.6 | <−9 | 4.75[3] | 11.6 | — |
| (11) | 0.13 μm CMOS | CS cascoded, single ended | 3.0-10.7 | 11 | <−10 | 2.2[2] | 4.8 | — |
| (12) | 0.18 μm CMOS | CS cascaded, single ended | 2.6-9.2 | 10.9 | <−11.5 | 3.5[2] | 7.1 | — |
| (13) | 0.13 μm CMOS | CG shunt feedback CCC, differential | 0.1-0.93 | 13 | <−15 | 4[2] | 7.2 | — |
| (14) | SiGe | CS shunt feedback, single ended | 2.0-10.0 | 13 | <−7 | 3.3[2] | 9.6 | — |
| (15) | 0.13 μm CMOS | CS cascoded + CS, differential | 2.0-5.2 | 16 | <−9 | 4.7-5.7 | 38.0 | — |
| (16) | 0.13 μm CMOS | CS cascoded + CS, differential | 2.0-4.6 | 9.5 | <−10 | 3.5[2] | 16.5 | — |
| LNA FIG. 3 | 0.18 μm CMOS | CG CCC Cascaded, differential | 7.7-8.4 | 19 | <−13 | 4.0[2] | 4.87 | 0.22@ 25 Mpps |
| LNA FIG. 4 | 0.18 μm CMOS | CS Cascoded, differential | 7.4-8.6 | 11 | <−6 | 4.5[2] | 4.87 | 2.8@ 25 Mpps |

[1]CS: common source, CG: common gate, SF: source follower, CCC: Capacitive Cross Coupled.
[2]Minimum value in the band
[3]Average
[4]Pdiss continuous The first LNA presented (FIG. 3), which uses a common gate capacitive-cross-coupling (CG-CCC) cascaded structure, has better performances for the same DC power consumption (basically in terms of gain) than the second LNA (FIG. 4), which uses a typical common source (CS) cascoded structure. Both LNAs have been designed in a 0.18 μm CMOS process with RF options.

However, when the ON/OFF switching is also considered, the CG CCC LNA fails to keep a fast switching (that is, for high data-rates), while the CS cascoded LNA behaves much better in such situation. As a result, the first LNA has good performances when the received pulses duration is in the order of 10 ns length, while the second one has its best performances when the pulse is in the order of few ns of length. Additionally, the CS cascoded LNA can be used to efficiently trade-off gain per dissipated power when the received pulse is long.

Compared to state of the art LNAs operated in continuous way, the CG CCC Cascaded LNA of the invention behaves very well, having the highest Gain/Power ratio. If it is ON/OFF switched, it can improve its consumption, although particularly for moderate data rates.

The CS Cascoded LNA of the invention, compared to the only LNA that is ON/OFF switched, behaves a 34% better, achieving 0.44 mW@50 Mpps.

The invention also refers to an impulse-radio receiver coupled to an antenna for receiving radio signals, having the previously described low noise amplifier for amplifying signals received by said antenna. The antenna can be for example a differential antenna.

The invention also refers to an integrated circuit having the previously described low noise amplifier, in its semiconductor die.

The invention also refers to a wireless communication device including the previously described low noise amplifier.

Further embodiments of the invention are described in the attached dependent claims.

In view of the description and set of drawings, a skilled person in the art will be able to understand that the implementations of the invention described may be combined in many ways within the purpose of the invention. The invention has been described according to some preferred embodiments of it, but for a skilled person in the art, it will be clear that many variations may be made to the preferred embodiments without departing from the object of the claimed invention.

What is claimed is:

1. A low noise amplifier including at least one circuit branch, a first circuit branch comprising at least first and second amplifying elements coupled to cooperate in amplifying an input signal, and switching means to switch on and off the amplifier, characterized in that the first amplifying element has an input node to receive said input signal, and wherein said switching means are only coupled to the second amplifying element to switch on and off the amplifier by acting on said second amplifying element, wherein the first amplifying element is a first common gate transistor, and the second amplifying element is a first common source transistor, and wherein the drain of the first common gate transistor is connected to the gate of the first common source transistor, wherein the gate of the first common source transistor receives a signal from the drain of the first common gate transistor, and wherein the gate of the first common source transistor is coupled to drain of the first common gate transistor through a first impedance, the value of said first impedance being selected at least in part to couple a signal at the drain of the first common gate transistor to the gate of the first common source transistor, and wherein a second impedance is connected between the source of the first common source transistor and the drain of the first common gate transistor, the value of said second impedance being selected at least in part to prevent a signal at the drain of the first common gate transistor from entering into the first common source transistor.

2. The low noise amplifier according to claim 1 wherein an output terminal of the first amplifying element is coupled to an input terminal of the second amplifying element, and an output node of the amplifier is coupled to the second amplifying element.

3. The low noise amplifier according to claim 1 wherein the first impedance is a coupling capacitor, and the second impedance is a choke inductor.

4. The low noise amplifier according to claim 1 wherein a bypass capacitor is connected between the source of the first common source transistor and ground.

5. The low noise amplifier according to claim 1 wherein a first inductive impedance is connected between the source of the first common gate transistor and ground, to choke the signal path to ground.

6. The low noise amplifier according to claim 1 wherein the drain of the first common source transistor is coupled to a DC power supply through a choke inductor.

7. The low noise amplifier according to claim 1 wherein the amplifier comprises two symmetric circuit branches to form a differential amplifier, wherein a second circuit branch comprises a second common gate transistor and a second common source transistor coupled in a cascaded configuration, and wherein the first and second common gate transistors of the amplifier are provided with a differential cross-coupling input scheme to feed an input signal to the amplifier.

8. The low noise amplifier according to claim 7 wherein the cross-coupling scheme comprises a series coupled capacitors.

9. The low noise amplifier according to claim 7 wherein a first coupling capacitor is connected between the gate of the first common gate transistor and the source of the second common gate transistor, and a second coupling capacitor is connected between the gate of the second common gate transistor and the source of the first common gate transistor, and wherein the input node is connected to the source of each common gate transistor.

10. The low noise amplifier according to claim 7 wherein the switching means are coupled to the gate of the common source transistors through a resistor selected to at least in part to prevent a signal at the gate of the common source transistors, from entering into the switching means.

11. The low noise amplifier according to claim 10 wherein the switching means comprises a pair of complementary transistors arranged to operate as a switch.

12. The low noise amplifier according to claim 10 wherein the switching means are operable by a square signal applied to the control node.

13. The low noise amplifier according to claim 1 wherein the transistors are implemented in CMOS technology.

14. The low noise amplifier according to claim 1 that is adapted to operate in an Impulse-radio ultra wide band system IR-UWB.

15. The low noise amplifier according to claim 1 that is adapted to operate within a band having a central frequency of approximately 8 Ghz.

16. The low noise amplifier according to claim 15 having bandwidth of approximately −3 dB.

17. An impulse-radio receiver coupled to an antenna for receiving radio signals, including the low noise amplifier according to claim 1 for amplifying signals received by said antenna.

18. An integrated circuit having a semiconductor die including at least one low noise amplifier according to claim 1.

19. A wireless communication device including the low noise amplifier according to claim 1.

20. The low noise amplifier according to claim 10 wherein the switching means comprise a pMOS transistor and an nMOS transistor, and wherein the drains of said transistors are coupled together to the gate of the common source transistor, and the gates of said transistors are connected together to a control node, the source of the pMOS transistor being connected to a DC power supply, and the source of the nMOS transistor being connected to ground.

21. The low noise amplifier according to claim 11 wherein the switching means comprise a pMOS transistor and an nMOS transistor, and wherein the drains of said transistors are coupled together to the gate of the common source transistor, and the gates of said transistors are connected together to a control node, the source of the pMOS transistor being connected to a DC power supply, and the source of the nMOS transistor being connected to ground.

22. The low noise amplifier according to claim 11 wherein the switching means comprises a pMOS transistor and an nMOS transistor, and wherein the drains of said transistors are connected together to the gate of the common gate transistor, and the gates are connected together to a control node, the source of the pMOS transistor being connected to a DC power supply, and the source of the nMOS transistor being connected to ground.

23. A low noise amplifier including at least one circuit branch, a first circuit branch comprising at least first and second amplifying elements coupled to cooperate in amplifying an input signal, and switching means to switch on and off the amplifier, characterized in that the first amplifying element has an input node to receive said input signal, and wherein said switching means are only coupled to the second amplifying element to switch on and off the amplifier by acting on said second amplifying element,
   wherein the first amplifying element is a common source transistor and the second amplifying element is a common gate transistor, wherein the source of the common gate transistor is connected to the drain of common source transistor so that both transistors are coupled in a cascode configuration,
   wherein the input node is coupled to the gate of the common source transistor through an inductive impedance, which is selected at least in part to match an input impedance.

24. The low noise amplifier according to claim 23 wherein an input node is coupled to the gate of the common source transistor, and an output node is coupled to the drain of the common gate transistor.

25. The low noise amplifier according to claim 23 wherein the drain of the common gate transistor is coupled to a DC power supply through a choke inductor.

26. The low noise amplifier according to claim 23 wherein it comprises two symmetric circuit branches to form a differential amplifier.

27. The low noise amplifier according to claim 23 wherein the switching means are connected directly to the gate of the common source transistors.

28. The low noise amplifier according to claim 27 wherein the switching means comprises a pMOS transistor and an nMOS transistor, and wherein the drains of said transistors are connected together to the gate of the common gate transistor, and the gates are connected together to a control node, the source of the pMOS transistor being connected to a DC power supply, and the source of the nMOS transistor being connected to ground.

29. A low noise amplifier including at least one circuit branch, a first circuit branch comprising at least first and second amplifying elements coupled to cooperate in amplifying an input signal, and switching means to switch on and off the amplifier, characterized in that the first amplifying element has an input node to receive said input signal, and wherein said switching means are only coupled to the second amplifying element to switch on and off the amplifier by acting on said second amplifying element, wherein the switching means comprise a pMOS transistor and an nMOS transistor, and wherein the drains of said transistors are coupled together to the gate of a common source transistor of the second amplifying element, and the gates of said transistors are connected together to a control node, the source of the pMOS transistor being connected to a DC power supply, and the source of the nMOS transistor being connected to ground.

30. A low noise amplifier including at least one circuit branch, a first circuit branch comprising at least first and second amplifying elements coupled to cooperate in amplifying an input signal, and switching means to switch on and off the amplifier, characterized in that the first amplifying element has an input node to receive said input signal, and wherein said switching means are only coupled to the second amplifying element to switch on and off the amplifier by acting on said second amplifying element, wherein the switching means comprises a pMOS transistor and an nMOS transistor, and wherein the drains of said transistors are connected together to the gate of a common gate transistor of the second amplifying element, and the gates are connected together to a control node, the source of the pMOS transistor being connected to a DC power supply, and the source of the nMOS transistor being connected to ground.

31. A method of amplifying a radio frequency signal using a plurality of amplifying elements coupled to cooperate in amplifying said radio-frequency signal, comprising the steps of receiving a radio frequency signal pulse frame and inputting the received signal to an amplification element, and switching ON the amplifier only during a time window substantially similar to the duration of said pulse frame, characterised in that the signal pulse frame is applied to a first amplifying element, and the amplifier is switched on and off by acting on a second amplifying element coupled to said first amplifying element, wherein the first amplifying element is a common gate transistor and the second amplifying element is a common source transistor, wherein the signal at the drain of the common gate transistor is applied to the gate of the common source transistor.

32. The method according to claim 31 wherein an output signal from the first amplifying element is applied as input signal to the second amplifying element.

33. The method according to claim 31 wherein the common source transistor is switched on and off by acting on the bias applied to its gate terminal.

34. A method of amplifying a radio frequency signal using a plurality of amplifying elements coupled to cooperate in amplifying said radio-frequency signal, comprising the steps of receiving a radio frequency signal pulse frame and inputting the received signal to an amplification element, and switching ON the amplifier only during a time window substantially similar to the duration of said pulse frame, characterised in that the signal pulse frame is applied to a first amplifying element, and the amplifier is switched on and off by acting on a second amplifying element coupled to said first amplifying element, wherein the first amplifying element is a common source transistor and the second amplifying element is a common gate transistor coupled in a cascode configuration.

35. The method according to claim 34 wherein the common gate transistor is switched on and off by acting on the bias applied to its gate terminal.

* * * * *